US008227769B2

(12) United States Patent
Sievers

(10) Patent No.: US 8,227,769 B2
(45) Date of Patent: Jul. 24, 2012

(54) CURING OF PHOTO-CURABLE PRINTING PLATES WITH FLAT TOPS OR ROUND TOPS

(75) Inventor: Wolfgang Sievers, Kremperheide (DE)

(73) Assignee: Esko-Graphics Imaging GmbH, Itzhoe (DE)

( * ) Notice: Subject to any disclaimer, the term of this patent is extended or adjusted under 35 U.S.C. 154(b) by 314 days.

(21) Appl. No.: 12/467,078

(22) Filed: May 15, 2009

(65) Prior Publication Data
US 2009/0294696 A1 Dec. 3, 2009

Related U.S. Application Data

(60) Provisional application No. 61/056,372, filed on May 27, 2008.

(51) Int. Cl.
G21K 5/02 (2006.01)
(52) U.S. Cl. .............. 250/492.1; 250/494.1; 250/504 R
(58) Field of Classification Search ............. 250/492.1, 250/493.1, 504 R, 494.1, 503.1
See application file for complete search history.

(56) References Cited

U.S. PATENT DOCUMENTS

| 5,386,268 | A | | 1/1995 | Ohlig et al. ............. 355/70 |
| 6,007,967 | A | * | 12/1999 | Kumpfmiller et al. ....... 430/306 |
| 2004/0129157 | A1 | * | 7/2004 | Dewitte .................. 101/382.1 |
| 2005/0011382 | A1 | | 1/2005 | Donahue et al. ........... 101/401.1 |
| 2005/0266358 | A1 | * | 12/2005 | Roberts et al. ............. 430/394 |
| 2007/0097196 | A1 | * | 5/2007 | Yoneyama ................. 347/102 |
| 2008/0157009 | A1 | * | 7/2008 | Wittenberg et al. ....... 250/494.1 |

FOREIGN PATENT DOCUMENTS
EP 1457823 9/2004

OTHER PUBLICATIONS

Extended European Search Report for EP Application 09161037.8, Sep. 19, 2009.

* cited by examiner

Primary Examiner — David A Vanore
Assistant Examiner — Nicole Ippolito
(74) Attorney, Agent, or Firm — Dov Rosenfeld; Inventek

(57) ABSTRACT

An apparatus for curing a printing plate made of or having photo-curable material, a method of curing such a printing plate, and a printing plate cured by the method. One embodiment of the method includes curing a printing plate made of or having photo-curable material thereon. The method includes producing light energy on part of the printing plate using a light exposure unit capable of generating at least a first illumination intensity and a second illumination intensity, such that curing can produce printing features on the plate that can be switched to have either flat tops or round tops according to the illumination intensity output by the light exposure unit.

47 Claims, 19 Drawing Sheets

CURING OF PHOTO-CURABLE PRINTING PLATES WITH FLAT TOPS OR ROUND TOPS

RELATED APPLICATION

The present invention claims benefit of and is a conversion of U.S. Provisional Patent Application No. 61/056,372 filed 27 May 2008 to inventor Sievers, the contents of which are incorporated herein by reference.

FIELD OF THE INVENTION

The present disclosure relates generally to preparing printing plates.

BACKGROUND

This disclosure describes a method and an apparatus for improving light exposure, e.g., ultraviolet exposure of photo-curable printing plates, e.g., photopolymer flexographic printing plates, letterpress plates and other polymer printing plates, as well as polymer sleeves and polymer coated printing cylinders. Photo-curable, of course, means curable by photons, e.g., light, e.g., light in the ultraviolet range or some other range.

Photopolymer plates have found a broad range of applications. A variety of different methods can be applied for transferring an image for printing, e.g., in the form of imaging data, to a polymer plate. For example, an image mask, which can be a film applied to the surface of the plate while the plate is exposed, or a layer directly on top of the polymer surface is laser ablated layer directly on top of the polymer surface, is placed on top of a polymer sheet.

By a digital plate is meant a plate that is exposed to imaging data by ablating a mask material that is on the plate, e.g., by exposure to laser radiation in an imaging device. The process of producing a digital plate is called a digital process herein.

By a conventional analog plate is meant a plate that is exposed to imaging data by exposing photographic film according to the imaging data, and then using the film to form a mask during exposure to curing radiation. The process of producing a conventional analog plate is called an analog process herein.

Irrespective of the way imaging data is transferred to the plate, the plate needs light, e.g., UV light for curing. Such UV curing is currently done by one of several different methods. After curing, the non-cured portions of the polymer are removed, either using solvents, or by melting the non cured material through heat treatment and absorption with a web.

Polymer printing plates are three dimensional, that is, include a depth dimension from the printing surface. Small printing details on the plate's surface carry ink for printing. Analog plates, i.e., plates produced using a conventional analog process can produce small features that have printing features that are substantially flat. Such a feature is called a flat top herein. It is much more difficult to produce such flat tops on digital plates, i.e., using a digital process. Features on digital plates tend to have rounded surfaces that extend down in depth. Such a feature is called a round top herein.

It would be advantageous to have a method and apparatus that allows the shape of the three dimensional printing features, such as halftone dots and other structures on the printing plate to be controlled, e.g., so that round tops or flat tops can be produced on a digital plate as an operator choice.

DESCRIPTION OF EXAMPLE EMBODIMENTS

Overview

Figure 1:
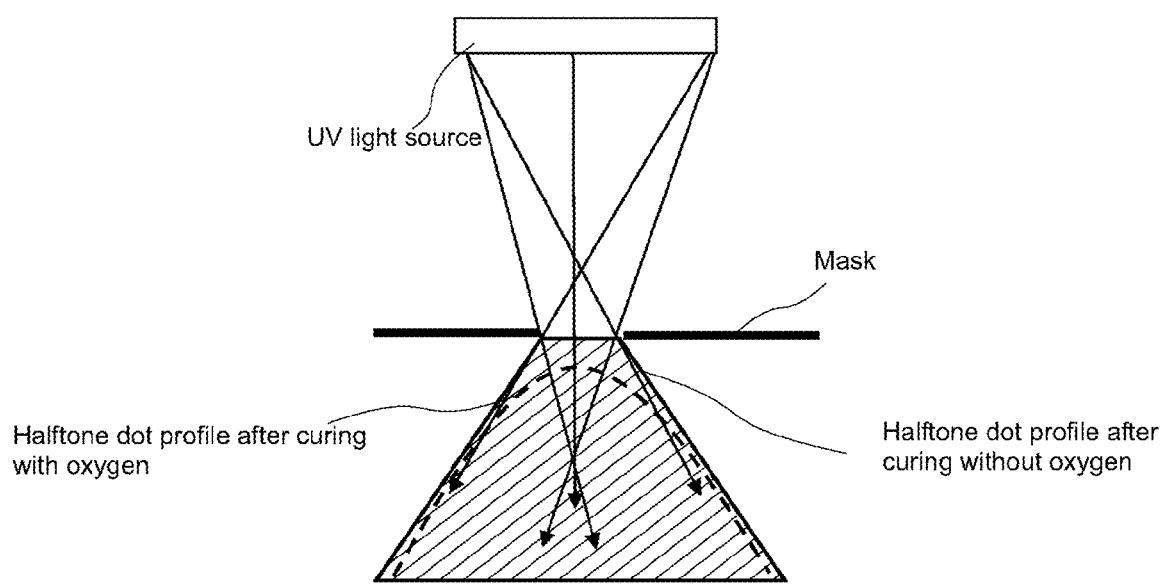
FIG. 1 shows a simple cross-section of an example halftone dot that results from UV exposure through a mask by UV light from a UV source.

Described herein is a method and apparatus, and a plate cured using the method. The method and apparatus allow the shape of the three dimensional printing features, such as halftone dots and other structures on the printing plate to be controlled.

This can be applied with digital flexography, digital letterpress printing, and other digital printing plates, as well as polymer sleeves and polymer coated printing cylinders.

One embodiment includes an apparatus for curing a printing plate made of or having photo-curable material e.g., UV-curable material thereon. The apparatus comprises a light exposure unit including a light source, e.g., a UV source to produce light energy, e.g., UV energy, the light exposure unit capable of generating at least a first illumination intensity and a second illumination intensity, and a power supply coupled to and configured to control the light exposure unit. The light exposure unit is capable of generating at least a first illumination intensity and a second illumination intensity such that curing can produce printing features that have flat tops or round tops on a part of the plate according to the illumination intensity output by the light exposure unit.

One embodiment includes an apparatus for curing a printing plate made of or having photo-curable material e.g., UV-curable material thereon. The apparatus comprises a light exposure unit including a light source, e.g., a UV source to produce light energy, e.g., UV energy, the light exposure unit capable of generating at least a first illumination intensity and a second illumination intensity. The apparatus further comprises a drive mechanism to produce relative motion between the light exposure unit and the plate during curing of the plate, and a control system coupled to and configured to control the drive mechanism and light exposure unit. The elements are arranged such that curing can produce printing features that have flat tops or round tops on a part of the plate according to the illumination intensity output by the light exposure unit during an initial time period of the total time period that light energy illuminates the photo-curable material on the part of the plate.

One embodiment includes a method of curing a printing plate made of or having photo-curable material thereon. The method includes producing light energy on part of the printing plate using a light exposure unit capable of generating at least a first illumination intensity and a second illumination intensity, such that curing can produce printing features on the plate that can be switched to have either flat tops or round tops according to the illumination intensity output by the light exposure unit.

One embodiment includes a method of curing a printing plate made of or having photo-curable material thereon. The method comprises producing light energy on part of the printing plate using a light exposure unit capable of generating at least a first illumination intensity and a second illumination intensity. The method further comprises producing relative motion between the light exposure unit and the plate during curing of the plate, and coordinating the relative motion and the illumination intensity from the light exposure unit. The steps are configured such that curing can produce printing features on the plate that can be switched to have either flat tops or round tops according to the illumination intensity output by the light exposure unit during an initial time period that light energy illuminates the photo-curable material.

One embodiment includes a photo-curable printing plate, cured according to a method of curing a printing plate made of or having photo-curable material thereon. The method comprises producing light energy on part of the printing plate using a light exposure unit capable of generating at least a first illumination intensity and a second illumination intensity. The method further comprises producing relative motion between the light exposure unit and the plate during curing of the plate, and coordinating the relative motion and the illumination intensity from the light exposure unit. The steps are configured such that curing can produce printing features on the plate that can be switched to have either flat tops or round tops according to the illumination intensity output by the light exposure unit during an initial time period that light energy illuminates the photo-curable material.

Particular embodiments may provide all, some, or none of these aspects, features, or advantages. Particular embodiments may provide one or more other aspects, features, or advantages, one or more of which may be readily apparent to a person skilled in the art from the figures, descriptions, and claims herein.

Curing Polymer Plates:

The term photopolymer plate, or in its shortened form, polymer plate is used herein to refer to any printing plate, cylinder or sleeve that is cured by application of light, such as ultraviolet (UV) radiation, i.e., that is made of or has thereon a photo-curable material such as a photopolymer. While today, the UV curable material is typically made of a polymer, hence the term, in this disclosure including the claims, a photopolymer plate, or a polymer plate for short means a plate, cylinder or sleeve made of or with any UV curable material thereon.

UV curing will briefly be described by way of background. The present invention, however, does not depend on any particular theory.

It is believed that the absence or presence of oxygen during the curing process plays an important role in the shape of the three-dimensional structure in the plate. It is believed that oxygen acts as an inhibitor to the polymerization: oxygen molecules end the chain reaction of polymerization and restrict the length of polymer chains formed by the polymerization.

A certain amount of oxygen already exists inside the plate materials when the UV curing starts. Additional oxygen from the surrounding air can enter the plate during the curing process once the oxygen concentration inside the plate drops.

FIG. 1 shows a simple cross-section of an example halftone dot that results from UV exposure through a mask by UV light from a UV source. The solid line shows the halftone dot profile when there is no or relatively little oxygen during curing, while the broken line shows a simple example of the sort of dot profile that results when there is a lot of oxygen during curing, i.e., during the polymerization process. The presence of oxygen is believed to cause shorter polymer chains than with less oxygen, resulting in a kind of melting of the halftone dots as shown in the broken line profile in FIG. 1.

Figure 2:
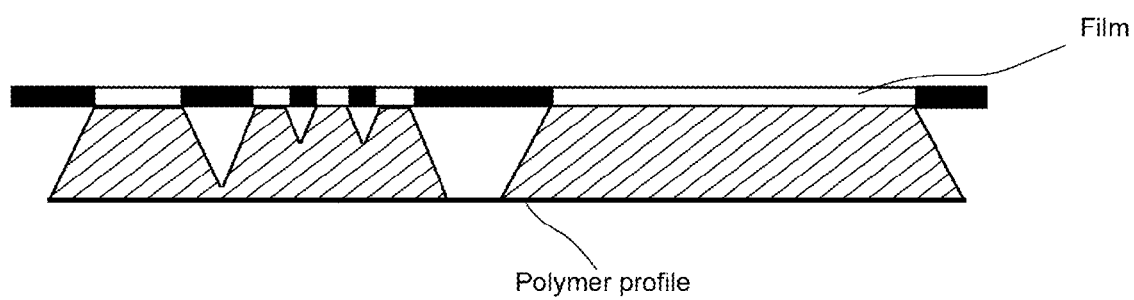
FIG. 2 which shows a simple cross-section of an example printing pattern with flat tops that results from UV exposure through a film mask by UV light from a UV source; the shape is called a flat top shape herein.

In an analog plate process, e.g., in which a film with the image thereon is placed on top of the polymer plate, and the polymer plate is cured by UV light, the UV light enters via the film. The film is believed to act as a barrier for the oxygen from the environment. This makes the polymer grow until the top of the surface like shown by the solid line in FIG. 1, and also as in FIG. 2 which shows a simple cross-section of a simple example printing pattern with flat tops that results from UV exposure through a film mask by UV light from a UV source. Such a shape is called a flat top shape herein.

Figure 3:
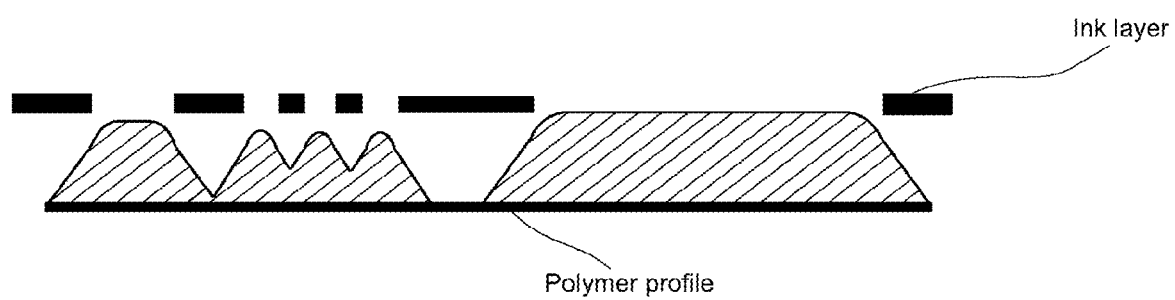
FIG. 3 shows a simple cross-section of an example printing pattern with round tops that results from UV exposure through a laser ablated film by UV light from a UV source; such a rounded shape is called a round top shape herein.

In a digital printing process, e.g., in which an ablatable layer is ablated with a laser beam, the plate material underneath is cured by UV light entering the plate through the revealed areas. Oxygen can also readily enter the plate through these ablated areas. It is observed that the halftone dots do not grow flat, and may not reach up to the original surface level of the polymer plate, but instead build round shaped structures which stay at slightly below the original surface level, as shown, for example by the dotted line of FIG. 1. FIG. 3 shows a simple cross-section of a simple example printing pattern with round tops that results from UV exposure through a laser ablated film by UV light from a UV source. Such a rounded shape is called a round top shape herein.

Digital processes offer the advantage that no film or film processing equipment or the related chemicals are necessary. Digital processes are also believed to be more precise and capable of smaller dot sizes and higher line count resolutions.

It is desired to obtain flat tops with a digital process. One known method includes placing a film over the ablated material during curing to simulate a conventional analog process. However, such a process is cumbersome, and furthermore, choosing between a flat top and a round top result requires more equipment and more workflow methods.

Described herein is an apparatus and a method of curing plates made of or having photo-curable material thereon that enables an operator to choose having features with flat tops or with round tops, and using the same digital workflow equipment for both cases.

Some Embodiments

Embodiments of the invention include a method of curing plates and an apparatus for curing printing plates. The plates are made of or have thereon photo-curable material, e.g., UV curable material such as photopolymer. The methods and apparatuses allow the shape of three dimensional printing features, such as halftone dots and other structures on the printing plate to be controlled.

Embodiments of the method and the apparatus are applicable to digital flexography, digital letterpress printing, and/or to making other digital printing plates, as well as for curing polymer sleeves and polymer coated printing cylinders.

The apparatus includes a light exposure unit including a light source, e.g., a UV source. The light exposure unit is capable of being adjusted to at least two different illumination intensity outputs, a first intensity level that is configured to produce round top features, e.g., round top halftone dots on the printing plate, and a second intensity level that is configured to produce flat top features, e.g., flat top halftone dots on the printing plate. The second intensity level is higher than the first intensity level.

In one embodiment, either the selected first or the second intensity level is applied to the total curing time, denoted T.

In an alternate embodiment, the second intensity level is applied first and for a significantly less than the total curing time T. In one embodiment, the time is approximately T/4, and the remaining time 3T/4 is applied at the first intensity level.

One embodiment includes a drive mechanism to produce relative motion between the light exposure unit and the plate during curing of the plate, and a control system configured to control the drive mechanism and the light exposure unit. The control system in one embodiment is configured to coordinate the relative motion and control the illumination intensity from the light exposure unit during the curing.

Figure 5:
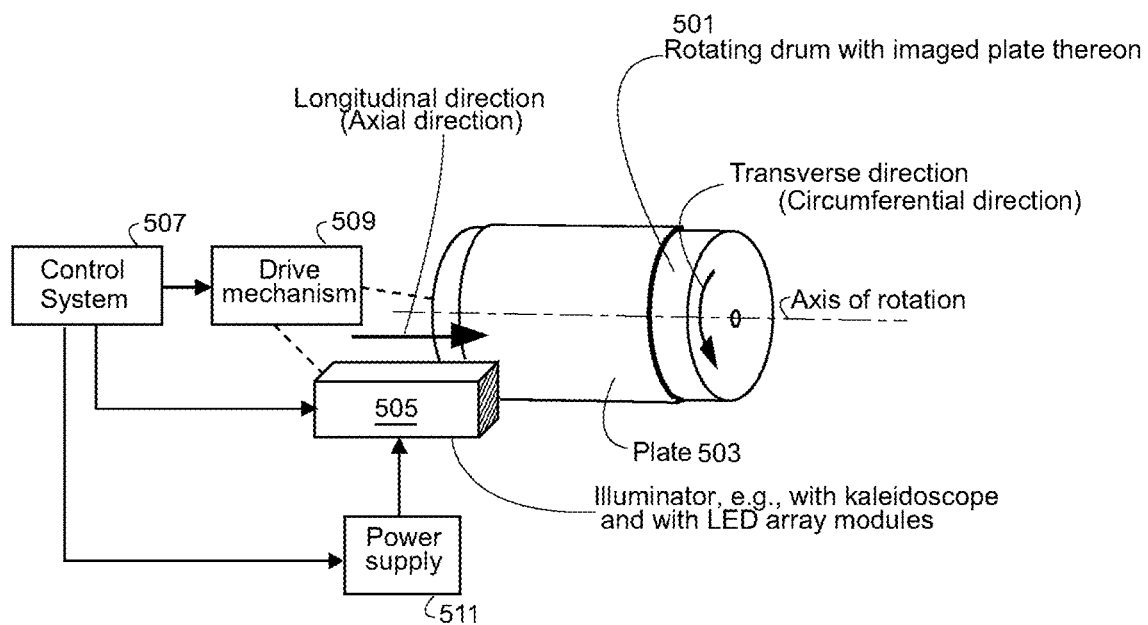
FIG. 5 shows a simplified block diagram of one embodiment of a curing apparatus that includes a rotating drum with a polymer plate thereon.

FIG. 5 shows a simplified block diagram of one embodiment of the invention that includes a rotating drum 501 with a polymer plate 503 thereon, the plate 503 being an imaged plate, that is, having with the image mask thereon. An exposure unit with light source 505, e.g., a UV source moves parallel to the drum axis in what is called the longitudinal direction. A control system 507 is connected to a drive mechanism 509, a power supply 511 and the exposure unit 505.

Some embodiment of producing more than one intensity level uses LED arrays, e.g., UV LED arrays. Such arrays are made, for example, by Nichia Corporation of Tokyo Japan. One feature of such LED arrays is the ability to adjust their UV output. The UV output intensity can simply be changed by changing the drive current supplied to the LEDs. Such LED arrays also feature having a relatively small amount of waste energy.

In one embodiment, the light source of exposure unit 505 includes a plurality of LEDs. The power supply 511 under control of the control system 507 is capable of switching the exposure unit with light source 505 between providing at least two different output levels including the first intensity level and the second intensity level, e.g., by switching some of the LEDs in the exposure unit on or off depending on the desired output intensity level. The first intensity level is configured to generate standard round top printing features such as halftone dots. The second intensity level is higher than the first intensity level and is configured to generate flat top printing features such as halftone dots.

Note that using LEDs that each are capable of the same intensity, the light exposure unit needs to include a higher number of LEDs compared to an exposure unit that is only capable of producing one illumination level for generating round tops. For example, the inventor discovered that for many typical plates, a ratio of 2 produces the desired result. For example, for common polymer plates such as Cyrel DPI™ from E.I. Dupont de Nemours and Company, Wilmington, Del. (DuPont), the time for the entire curing process is between 12 and 15 minutes at an illumination intensity (power per unit area) of 19-20 mW/cm$^2$. Doubling the intensity from 20 mW/cm$^2$ to 40 mW/cm$^2$ gives a significant change from a convex round tops to flat tops. In such an example, twice as many LEDs are needed compared to a curing system for curing in the specified standard way for such plates that would, for digital plates, typically result in round tops.

Figure 6:
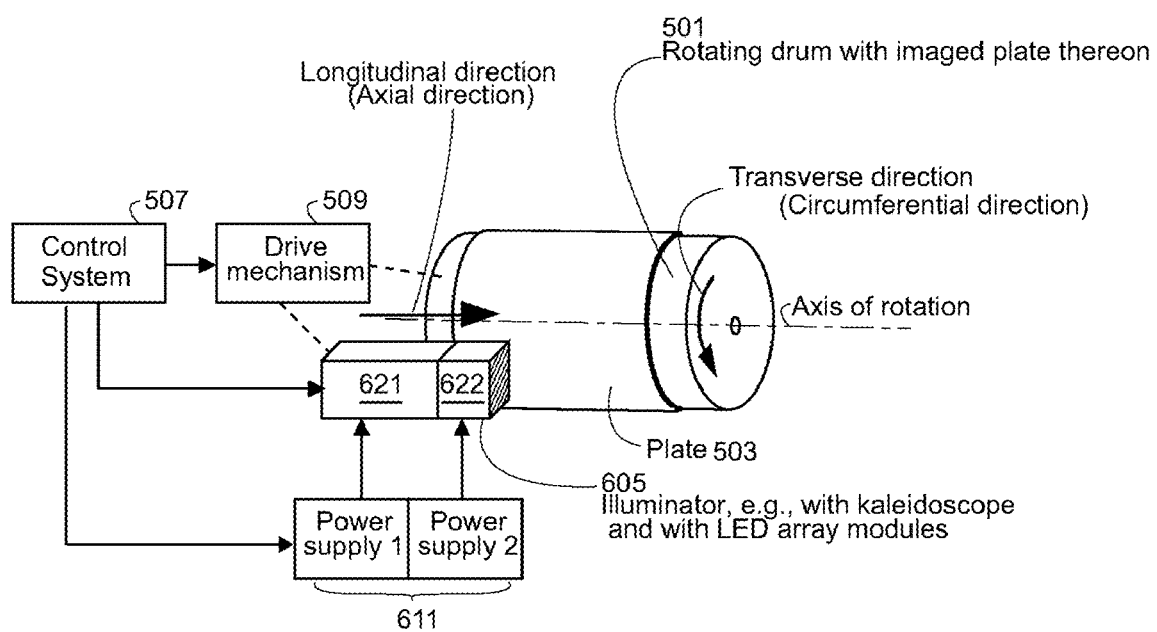
FIG. 6 shows a block diagram of one embodiment of a curing apparatus that includes a rotating drum with a polymer plate thereon that that uses an exposure unit with a light source that includes two sections, a first section and a second section.

LED exposure units today are expensive. FIG. 6 shows a block diagram of one embodiment of a curing apparatus that uses an exposure unit 605 with a light source that includes two sections, a first section 621 and a second section 622. A power supply 611 in some embodiments is able to control at least the light output of one section independent of the other. In particular, in some embodiments, the illumination intensity of each section can be controlled independently.

The first section 621 includes the same number of LEDs as required for standard illumination at the first intensity level, which is sufficient to cure round tops. The second section 622 is smaller than the first section 621, and is configured to illuminate any area of the plate ahead of the first section 621, e.g., it travels ahead of the first section 621 in the longitudinal direction. The second section 622 is equipped with more LEDs per area unit than the first section 621 so that the second section can illuminate at the higher second intensity level, which is sufficient to cure flat tops. The control system is configured so that the first section 621 operates the whole curing time at the first intensity level. In one embodiment, the second section 622 can be switched to illuminate at either the first intensity level or at the higher second intensity level, so that an operator can select whether features are cured to have flat tops or round tops.

The inventor has discovered that the surface area illuminated by the second section 622 can be significantly smaller than the area of the first section 621. This may be because the significant change in the shape of the halftone dots from round top to flat top occurs in the part of the halftone dot closest to the printing surface, while the inner part remains the same for round tops or flat tops. See FIG. 1. Curing of the curable material, e.g., the polymer, appears to start at the surface and propagate with time into the depth of the material. The inventor has found that it is sufficient to cure only the upper parts during the first minutes with the higher second intensity level, while the deeper parts of features such as halftone dots can be cured at the lower first intensity level.

The inventor also has found that curing for approximately a quarter of the total curing time at the higher second intensity level is sufficient to produce the desired flat tops. Therefore, in one embodiment in which the footprint of the exposure unit 605 is approximately of constant width in the transverse direction perpendicular to the longitudinal direction, the length of the second section 622 in the longitudinal direction is one quarter of the entire length of the light source of the exposure unit 605, that of the sum of the lengths of first section 621 and the second section 622 in the longitudinal direction.

Because only one quarter of the area needs double the number of LEDs (assuming each LED has constant output), the number of LEDs is 25% more than a standard exposure unit. That is, if the embodiment of FIG. 5 requires 2N LEDs to expose at the second intensity level, then one embodiment with the two sections 621 and 622 needs 1.25N LEDs.

While one embodiment includes a light exposure unit that includes LED arrays, alternate embodiments may use different ways of achieving the (at least two) output illumination intensities.

In one alternate embodiment, the light source includes a plurality of arc lamps, arranged such that some can be switched on and off, or that a shutter or other mechanism is included to achieve two controllable output levels.

In another embodiment, the light source includes a combination of fluorescent light tubes and LEDs. In one version, one form of illumination—e.g., the using of LEDs occurs at the start of curing of any region to start the curing process, and the second form of illumination, e.g., the using of the fluorescent illumination, occurs for the remainder of the curing. In another embodiment, both illumination forms are used for completion of the curing.

In another embodiment, the light source includes a combination of fluorescent light tubes and arc lamps. One form of illumination is used to start the curing process, and in one embodiment, the other used for completion of the curing, or, in another embodiment, both are used for completion of the curing.

Thus, in one embodiment, the light source is divided into two sections that illuminate different sized areas, and wherein at least one section's light output intensity can be controlled independently of the other section's light output intensity. In some embodiments, the illumination intensity of each section can be controlled independently.

In some embodiments, the smaller area section is capable of generating higher output intensity than the larger area section. In some embodiments, the illumination from the smaller area section hits a region in plate's photo-curable material before the radiation from the larger area section hits the region.

FIG. 6 for example, shows the power supply as including two power supply units. Of course, those in the art will understand that there are many different ways of achieving the two illumination levels, and any method of achieving the different illumination levels can be used in different embodiments.

Note that the control system in one embodiment is such that the first region is switchable between either at the first or the second illumination intensity. In some embodiments, the second illumination intensity can be increased continuously to a level being sufficient to cure a desired shape between round top and flat top in the polymer.

Thus, one embodiment has been described in which the drive mechanism causes the light source to move along the direction of the axis or rotation of a rotatable drum having a plate thereon while the drum is rotated by the drive mechanism in order to cure the curable material of or on the plate.

In another one embodiment, the plate is on a flatbed, e.g., of a flatbed scanner, also called an x-y table, and a drive mechanism is configured to produce relative motion between the exposure unit and the plate.

Figure 7:
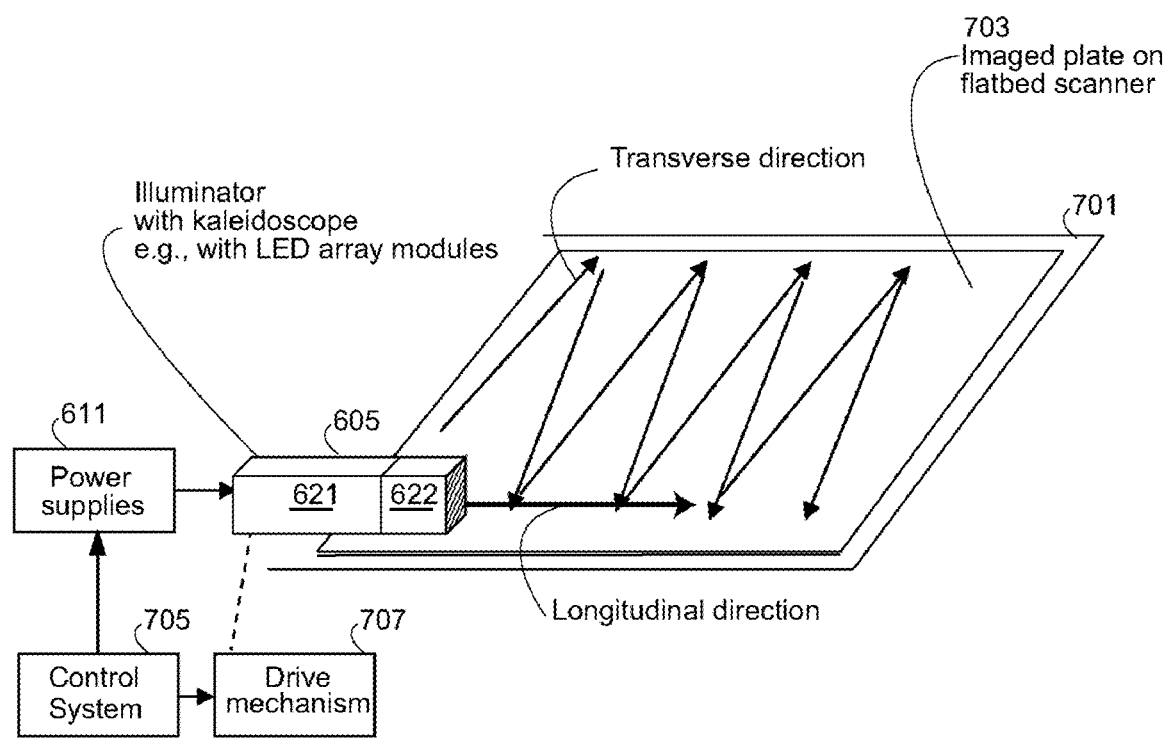
FIG. 7 shows in simplified form one example embodiment of a flatbed illuminating arrangement for using a light source that includes two sections for curing a plate.

In one such embodiment, the light source moves during curing above the plate placed on a flatbed table. FIG. 7 shows a simplified block diagram of one embodiment of such a flatbed 701 in which a plate 703 with a mask thereon is cured. A control system 705 is coupled to a power supply 611 and configured to control the output of an illumination unit 605 that includes a first illumination section 621 and a second illumination section 622. The control system 705 also is coupled to and configured to control a drive mechanism 707 that is configured to move the illumination unit 605 back and forth in a transverse direction while also moving the illumination unit 605 in a longitudinal direction.

Figure 8:
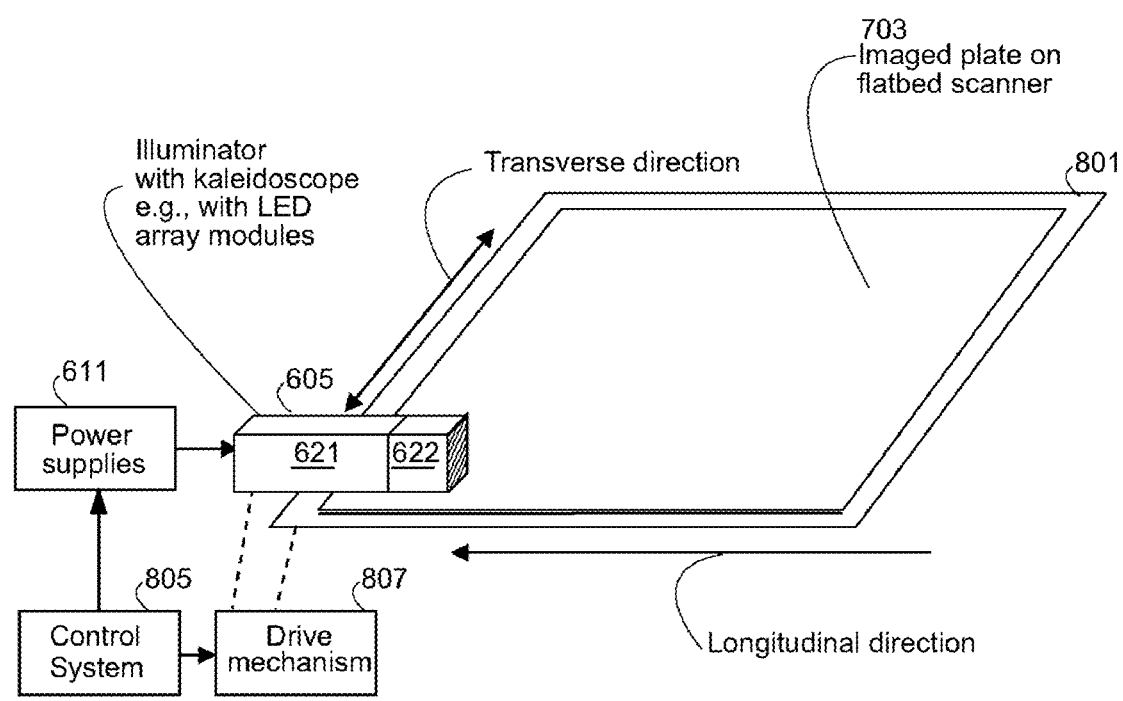
FIG. 8 shows in simplified form another example embodiment of a flatbed illuminating arrangement for using a light source that includes two sections for curing a plate.

In another embodiment, the light source moves during curing in a transverse direction and the polymer plate moves during curing in a longitudinal direction perpendicular to the transverse axis. FIG. 8 shows a simplified block diagram of one embodiment of such a flatbed 801 in which a plate 703 with a mask thereon is cured. A control system 805 is coupled to a power supply 611 and configured to control the output of an illumination unit 605 that includes a first illumination section 621 and a second illumination section 622. The control system 805 also is coupled to and configured to control a drive mechanism 807 that is configured to move the illumination unit 605 in a transverse direction while also moving the plate in a longitudinal direction.

One advantage of the embodiments shown is that inline curing combined with imaging is possible. That is, the imaging and curing may be combined in the one apparatus. In some versions of the apparatuses shown in FIGS. 6, 7 and 8, a laser imaging unit including imaging elements is included and configured to transfer imaging data to the part of the plate precedes the curing illuminating part. In such a case, the plate is at some stage partially imaged.

In another embodiment, the imaging occurs separately prior to the plate being loaded for exposure to UV for curing. In such a case, the plate is fully imaged.

Figure 15:
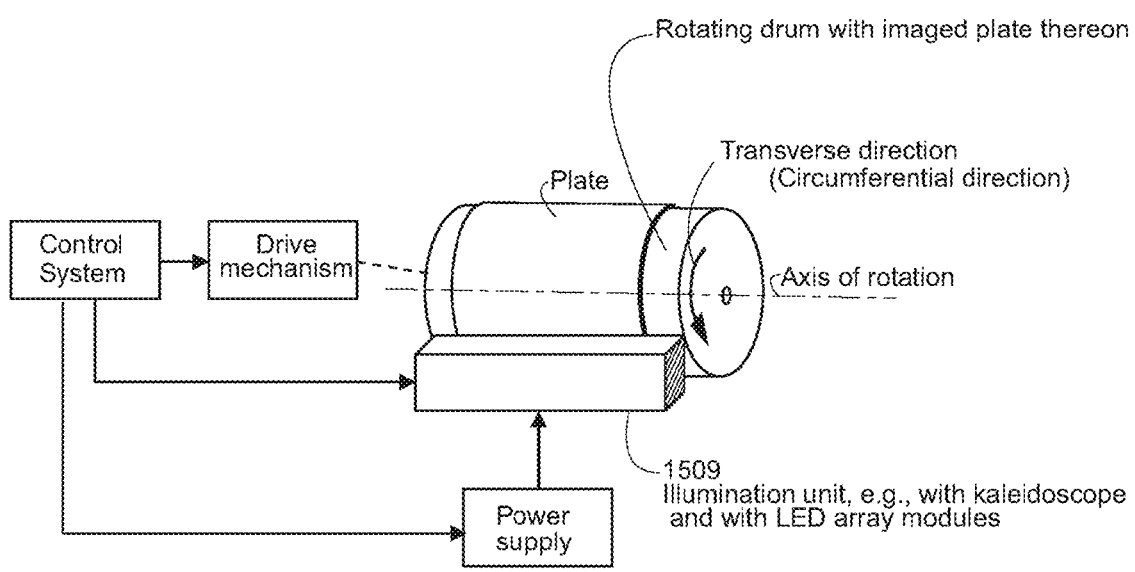
FIG. 15 shows an embodiment of a rotating drum arrangement in which the illumination unit extends to cover one dimension of the plate.

FIG. 15 shows a simple drawing of yet another embodiment of a rotating drum arrangement. In this arrangement, an illumination unit 1509 is configured to illuminate at two levels, a first illumination level and a second illumination level. In this embodiment, the illumination unit 1509 extends to cover one dimension of the plate. In the example shown, this is the longitudinal direction. Relative motion in only one direction is then necessary, in this example, the circumferential, i.e., transverse direction. One advantage of the embodiment shown is that with it, inline curing is possible.

Figure 16:
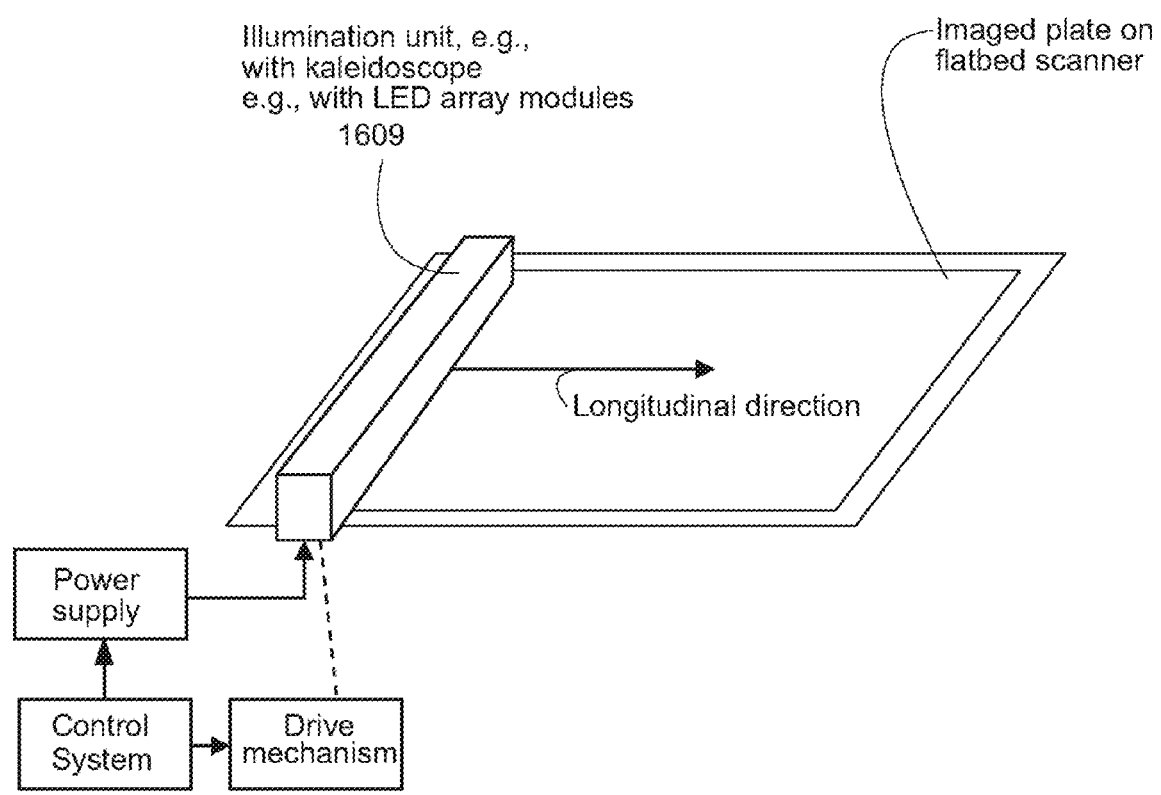
FIG. 16 shows an embodiment of a flatbed arrangement, in which the illumination unit extends to cover one dimension of the plate.

FIG. 16 shows another simple drawing of yet another embodiment, this one a flatbed arrangement, in which an illumination unit 1609 extends to cover one dimension of the plate. In the example shown, this is the transverse direction. Relative motion in only one direction is again used, in this example, the longitudinal direction. In this example, the exposure unit moves in the longitudinal direction over the plate.

Figure 17:
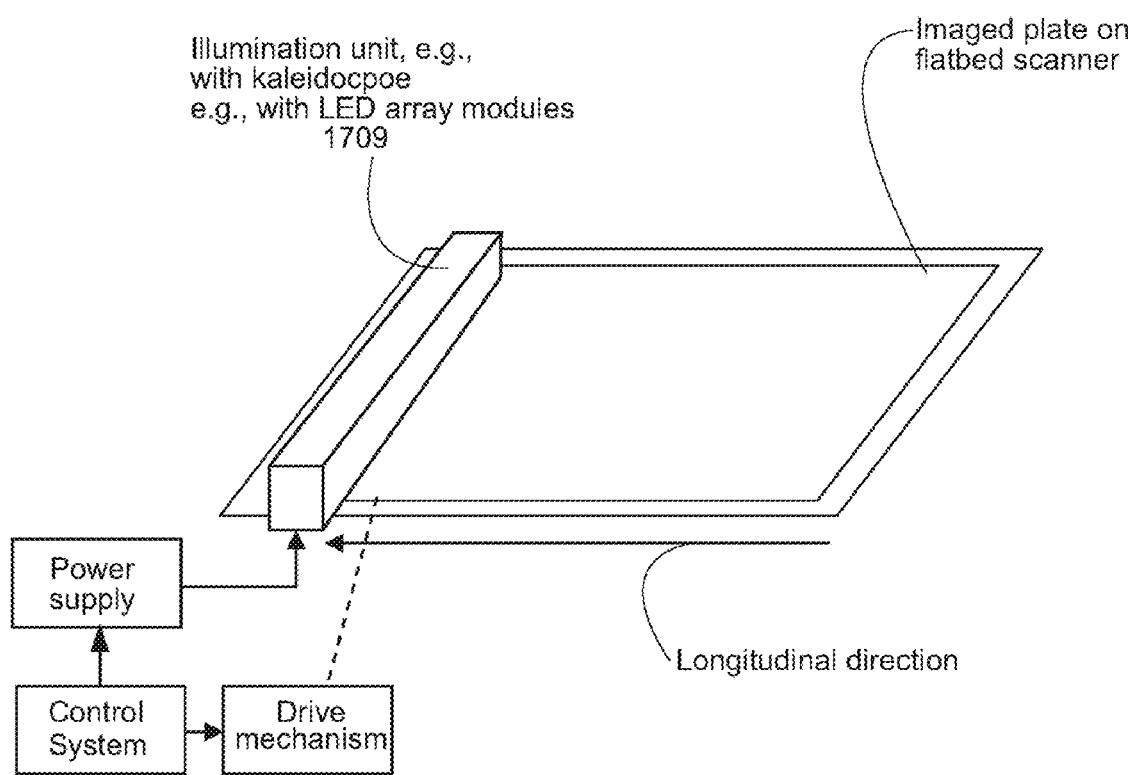
FIG. 17 shows another embodiment of a flatbed arrangement in which the illumination unit extends to cover one dimension of the plate, in this case with the relative motion provided by the plate moving in the longitudinal direction.

FIG. 17 shows another embodiment of a flatbed arrangement in which an illumination unit 1709 extends to cover one dimension of the plate, in this case with the relative motion provided by the plate moving in the longitudinal direction.

Figure 18:
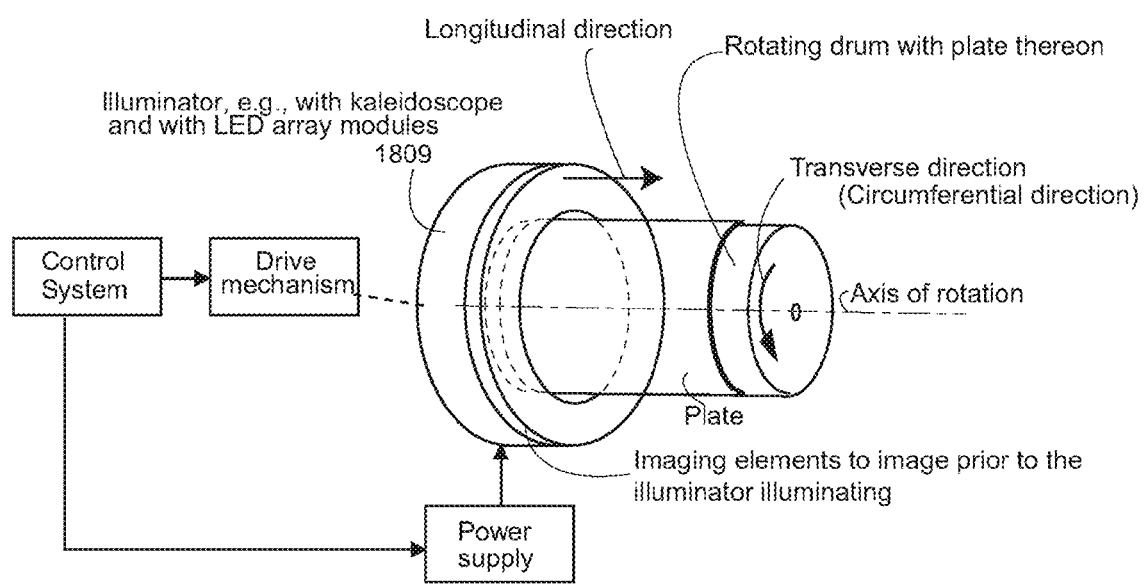
FIG. 18 shows another embodiment of a rotating drum arrangement in which the illumination unit extends to cover one dimension of the plate, in this case the circumferential direction.

FIG. 18 shows a simple drawing of yet another embodiment of a rotating drum arrangement in which the illumination unit 1809 extends to cover one dimension of the plate, in this case the circumferential direction. In the example shown, the illumination unit wraps around the drum, e.g., is in the form of a toroid around the drum. Relative motion is provided in the longitudinal direction. No rotation of drum is necessary for curing, but of course might still occur, e.g., as the drum is slowing down, in another embodiment, in line with the imaging. That is, a laser imaging apparatus including imaging elements is included and configured to transfer imaging data to the part precedes the illuminating part. Note that details of the imaging are not shown in order not to obscure the curing operation of the apparatus.

In FIGS. 6 to 8 and 15 to 18, some elements such as the illuminating source have different reference numbers but may be similar or identical in structure. Similarly the plate and other shown elements may be similar or identical even if different reference numerals are used.

Note that some of the arrangements above may include an imaging unit to enable inline imaging and curing. Other arrangements do not include the imaging unit. The invention is not limited to combining of the imaging and curing in one exposure apparatus, and in some arrangements, the imaging and curing can be carried out separately each in its own apparatus. Therefore, in some arrangements, there is a separate imaging apparatus, e.g., a rotating drum imaging apparatus as is known in the art, or a flatbed imaging apparatus as is known in the art, and also a separate curing apparatus, e.g., a flatbed arrangement that include one or more features of the present invention or a rotating drum arrangement that include one or more features of the present invention.

Other variations also are possible.

An LED Source

In one embodiment, the light exposure unit includes a light tunnel of light reflective, e.g., mirrored walls and has a polygonal cross-section like a kaleidoscope. One such light exposure unit is briefly described herein. Other such light exposure units are described in more detail in U.S. Provisional Patent Application No. 61/055,910 filed 23 May 2008 to inventor Sievers, the contents of which are incorporated herein by reference.

Figure 9A:
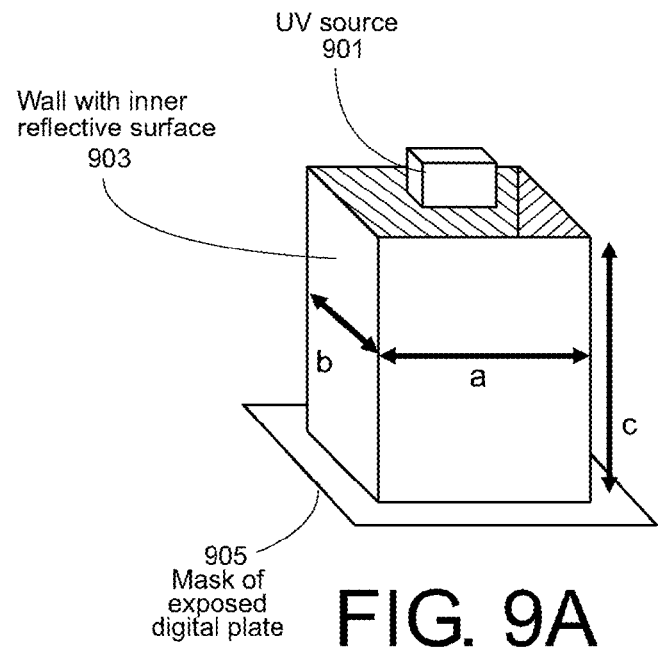
FIG. 9A shows a simplified drawing of one example of a light tunnel light exposure unit that can be used in embodiments of the present invention.

FIG. 9A shows a simplified drawing of one example of a light tunnel light exposure unit. The light tunnel includes four side walls 903 each having a reflective inner surface, e.g., by each wall being mirrored or having a mirror attached on the inner surface, so that the light tunnel has a rectangular cross-section. Other embodiments have cross sections that are other than rectangular. In FIG. 9A, the dimensions for a rectangular cross-section are shown as the width of the long side, denoted a, the width of the wide side, denoted b, and the light tube length, also called its height, denoted c. A UV source 901 located at or near one end, called the source end of the light tunnel and arranges in operation to produce light radiation, e.g., UV radiation to the inside of the light tunnel towards the other end of the light tunnel, called the plate end, including towards the reflective inner surfaces of the walls. The plate end is placed near an exposed mask 905 that is on the surface of photocurable plate material, e.g. a polymer plate. Typically, the mask 905 is an exposed part of a digital plate. The dimensions a, b, and c are configured according to parameters such as the plate size in the case of illuminating a whole plate, the power output(s) of the light source, that is, the power output of the light tube and how much of the power is directed towards the inside of the tube.

Figure 9B:
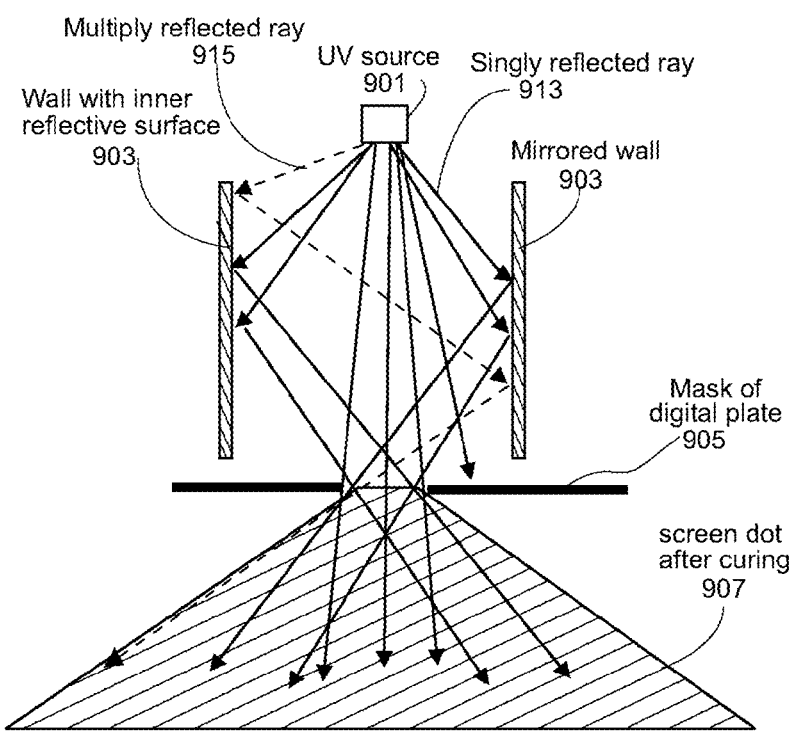
FIG. 9B shows a simplified cross-section of light tunnel and light source, e.g., UV source and also the cross-section of an example halftone dot exposed by a light exposure unit that includes a light tube and a light source capable of a first intensity level and a second intensity level, including pair of opposite mirrors of a "kaleidoscope" light tube made of pairs of opposite walls with reflective inner surfaces, e.g., mirrors in accordance with an embodiment of the present invention.

FIG. 9B shows a simplified cross-section of light tunnel and light source, e.g., UV source and also the cross-section of an example halftone dot 907 exposed by a light exposure unit that includes a light tube and a light source capable of a first intensity level and a second intensity level, including pair of opposite mirrors of a "kaleidoscope" light tube made of pairs of opposite walls 903 with reflective inner surfaces, e.g., mirrors in accordance with an embodiment of the present invention. The support shoulders of the halftone dot 907 that result by exposure by such a "kaleidoscope" source is broader than if the same UV source 901 was used without the kaleidoscope light tunnel. FIG. 9B shows singly reflected ray such as ray 913 and a multiply reflected ray of light 915, e.g., of UV. Having such multiple wall reflections in a kaleidoscope broadens the shoulders that support small features such as a halftone dot. The ray 915 that is so-reflected multiple times is shown by a dotted line.

Figure 9C:
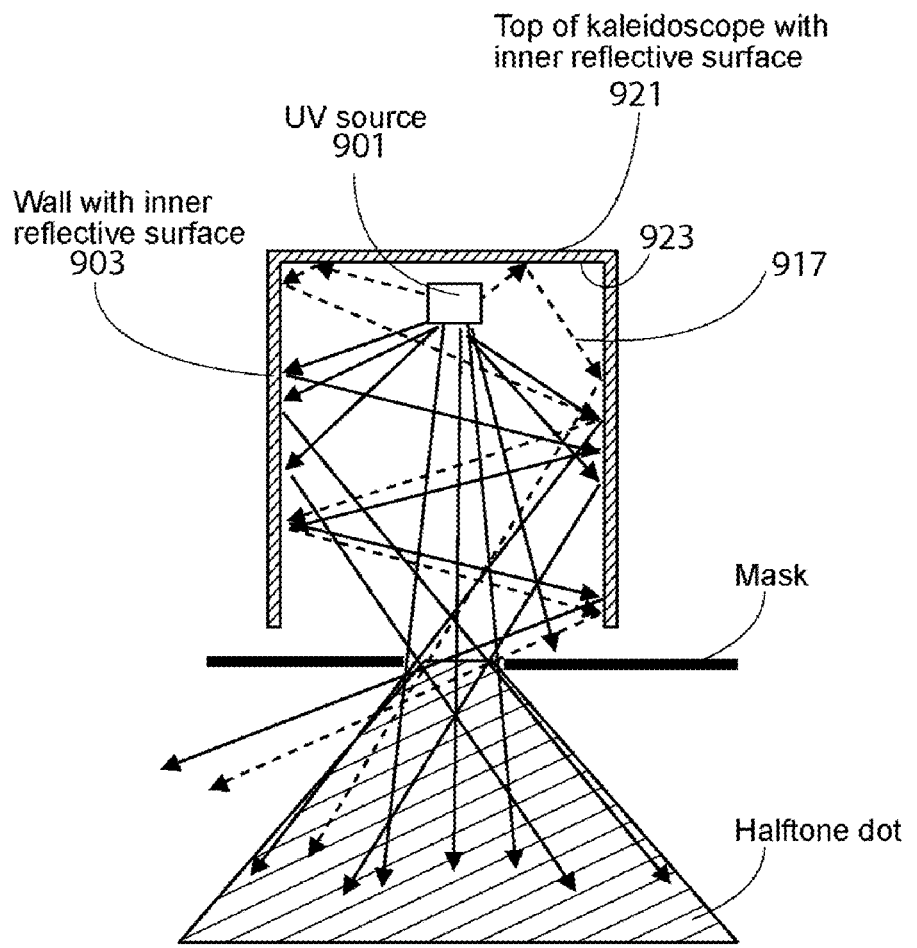
FIG. 9C shows a simplified cross-section of a halftone dot exposed by a source using a light tube that includes, in addition to the side walls with respective inner reflective surfaces, an additional another element with an inner reflective surface located behind the light source and parallel to the photo-curable plate.

FIG. 9C shows a simplified cross-section of an example cured halftone dot exposed by a light source 901, using a light tube that includes, in addition to the side walls 903 with respective inner reflective surfaces, an additional another element 921 with an inner reflective surface 923, e.g., a flat mirror located behind the light source, e.g., UV source and parallel to the polymer plate. In FIG. 9C, rays that are reflected off the flat mirror behind the light source, e.g., rays 917 are shown as broken lines.

In different embodiments of the kaleidoscope illuminator such as FIGS. 9A, 9B or FIG. 9C, the reflective surface can be made of different materials. In general, the reflectors of embodiment can be built of flat mirrors or of materials with reflective surfaces, so these walls having reflective inner surfaces can be inexpensive and easy to build.

In some embodiments, the reflective surfaces include metal coated glass plates such as conventional glass mirrors.

In other embodiments, the light source is a UV source, and the walls are made of UV reflective material coated aluminum sheets, with the inner surfaces coated with the reflective material.

In some version of such aluminum sheets, the respective reflective surface of at least some of the walls is embossed with UV light diffusing structures.

In some embodiments, the light source is a UV source comprising a fluorescent tube. In other embodiments, the light source is a UV source comprising a mercury lamp.

In some embodiments, the light exposure unit is in a fixed position above a flat lying photopolymer printing plate positioned to cure the plate by exposure for a sufficient exposure time. Consider for example, the illumination arrangement of FIGS. 9A, 9B or FIG. 9C. Denote the power density, i.e., the intensity, e.g., in W/cm² by H. For a given UV power the intensity of the illumination H is:

$$H=P/(a*b);$$

where P denotes the power out of the aperture and * denotes multiplication.

The exposure, denoted E to the plate is then E=H*T, e.g., in J/cm² if P is in W/cm², where T denotes the exposure time in s. A sufficient exposure time is required for curing in order to ensure that the chain reactions that cause curing have sufficient time. Thus, the requirements for curing are energy, e.g., as an intensity in J/cm² applied over a particular curing time T.

The light tube length c affects the degree of commingling the angle of incidence. The inventors have noticed that the longer the light tube length, the more homogeneous is the angle distribution.

In some embodiments, the light source is a UV source comprising an array of UV LEDs. Such UV LEDs are available, for example, from Nichia Corporation, Tokyo Japan. Such UV LEDs have several desirable (albeit not necessary) properties, e.g., they exhibit high spectral purity with 100% of their output power at 365 nm. The wavelength has almost no temperature dependence. They produce relatively little heat, they do not overly heat a plate's polymer material. They age slowly, e.g., about 5% power reduction over 1000 h of use, so provide long life with low maintenance requirement. The power output is proportional to the applied electric power.

Nichia Corporation makes for the assignee of the present invention an array module that has between 100,000 and 200,000 UV LEDs. With 21A input at 4.4V, such an array module is capable of about 10 W of UV output at a wavelength of 365 nm. The array module includes microchannels for water cooling, and typically uses water that is purified, e.g., free of ions or any particles larger than about 50 µm.

One embodiment of the invention uses a light source made up of such LED array modules. One embodiment of such a UV light source includes 20 such array modules combined to produce a UV light source for a light tube that has a rectangular cross section of about 8 cm by 42 cm. The light source embodiment produces in operation light output of up to 200 W of 365 nm UV radiation. The light source is used, for example, with an external drum exposure system as described further below.

Figure 10:
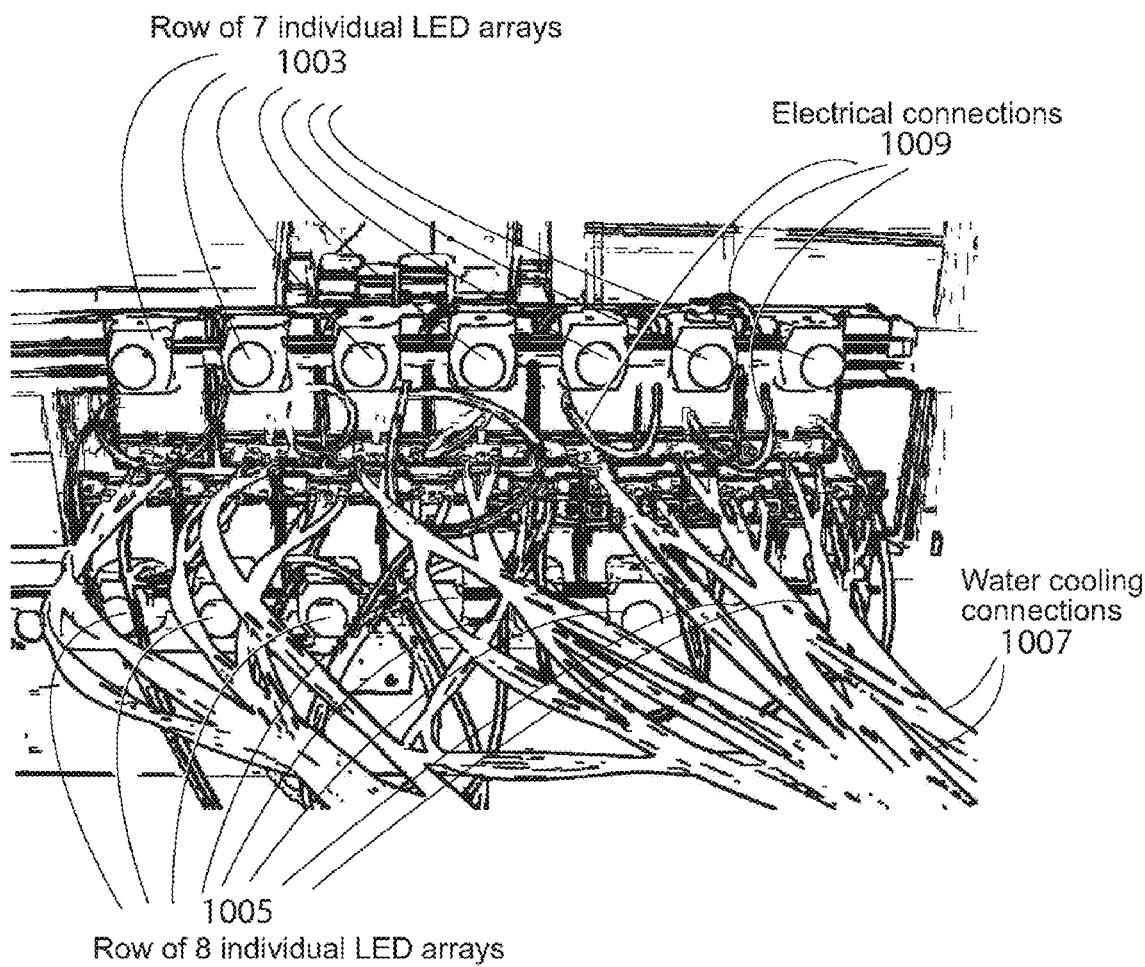
FIG. 10 shows a line drawing made from an actual photograph of an LED array-based light source of the type used in some embodiments of the invention.

One example of such an array, using 15 LED array modules, is now described in more details. FIG. 10 shows a line drawing made from an actual photograph of an LED array light source. The light source includes two rows 1003 and 1005 of LED array modules, a first row 1003 of 7 modules shown parallel to a second row 1005 of 8 array modules. Each row is offset ½ of the separation of array modules—the array module pitch—relative to the other row. The water cooling connections, e.g., pipes 1007 and electrical connections, e.g., wires 1009 for connecting power to the modules can clearly be seen.

Figure 11:
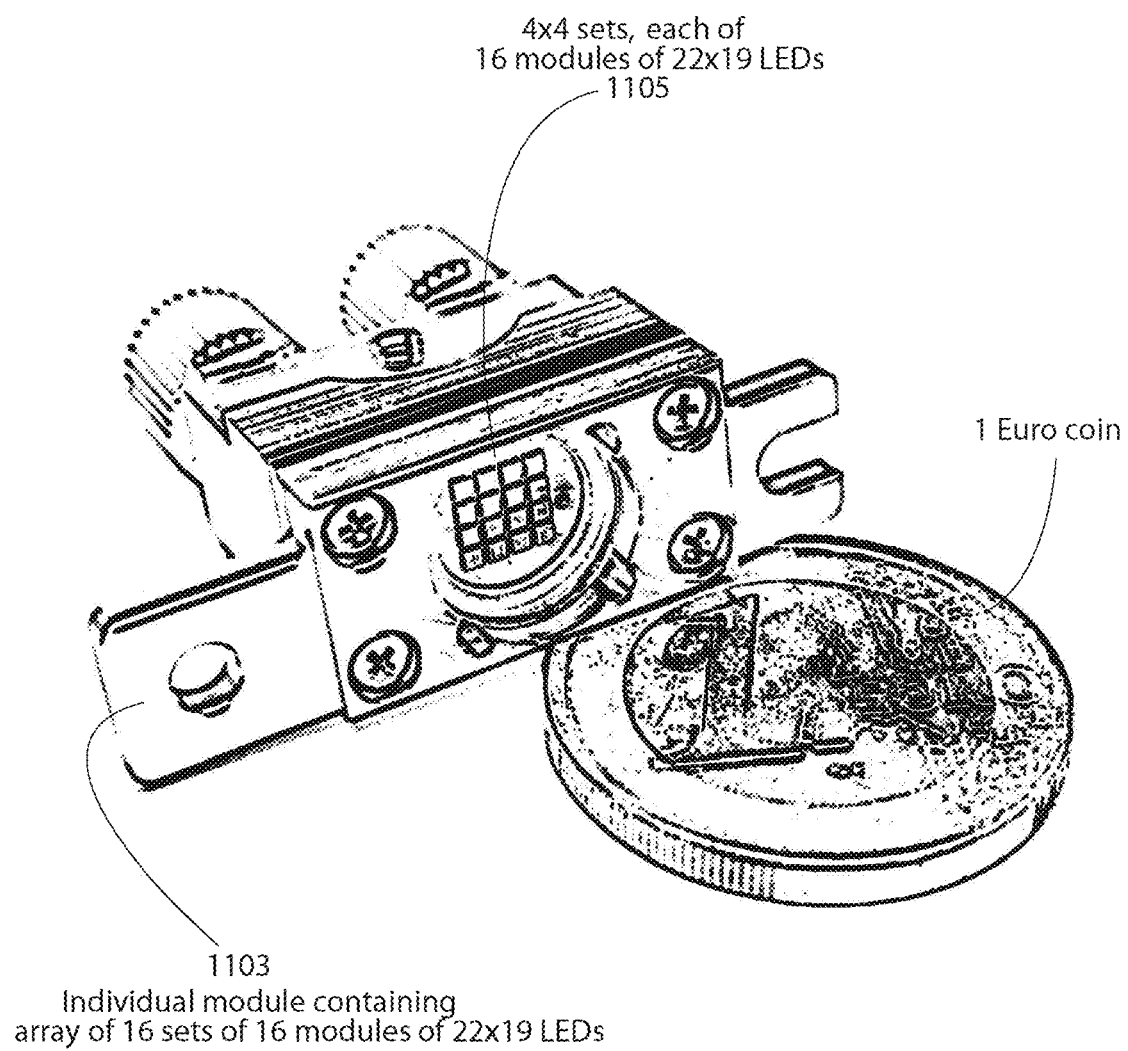
FIG. 11 shows a line drawing of a perspective view of an individual LED array module, and is from an actual photograph.

FIG. 11 shows a line drawing of a perspective view of an individual LED array module 1103, and is from an actual photograph. The heat sink and water input/output can clearly be seen. A 1 Euro coin (23.25 mm in diameter) is also shown to give a sense of the size. The source itself includes a 4×4 matrix 1105 of sets of LEDs. As will be seen in the following photographs, each set includes a 4×4 array of LED units, and each LED unit includes 22×19 LEDs. In such an arrangement, there are therefore 16×16×22×19=107008 UV LEDs.

Figure 12:
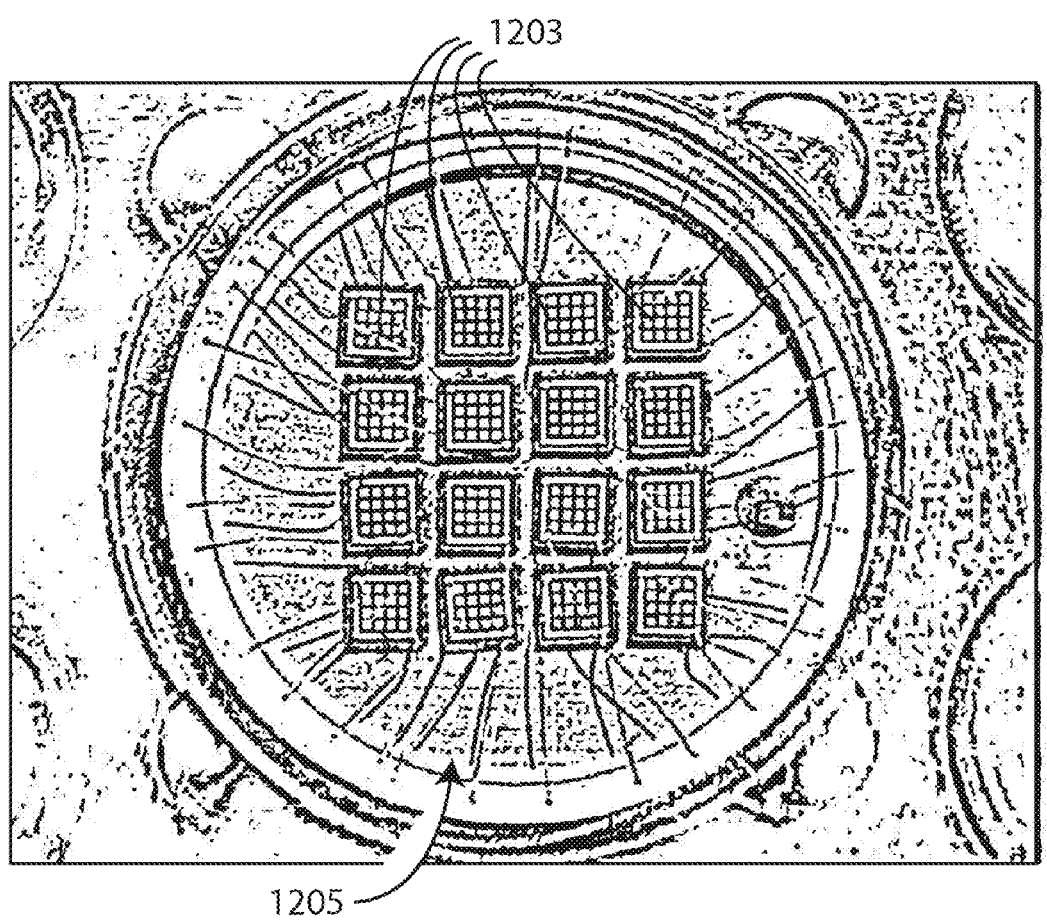
FIG. 12 shows a line drawing made from a photograph of an enlarged view of an array module such as shown in FIG. 1, and shows a 4×4 matrix of sets of LEDs and leads thereto.

FIG. 12 shows a line drawing made from a photograph of an enlarged view of an array module and shows the 4×4 matrix 1105 of sets 1203 of LEDs and leads thereto. Each set 1203 can be seen to include a 4×4 array of LED units.

Figure 13:
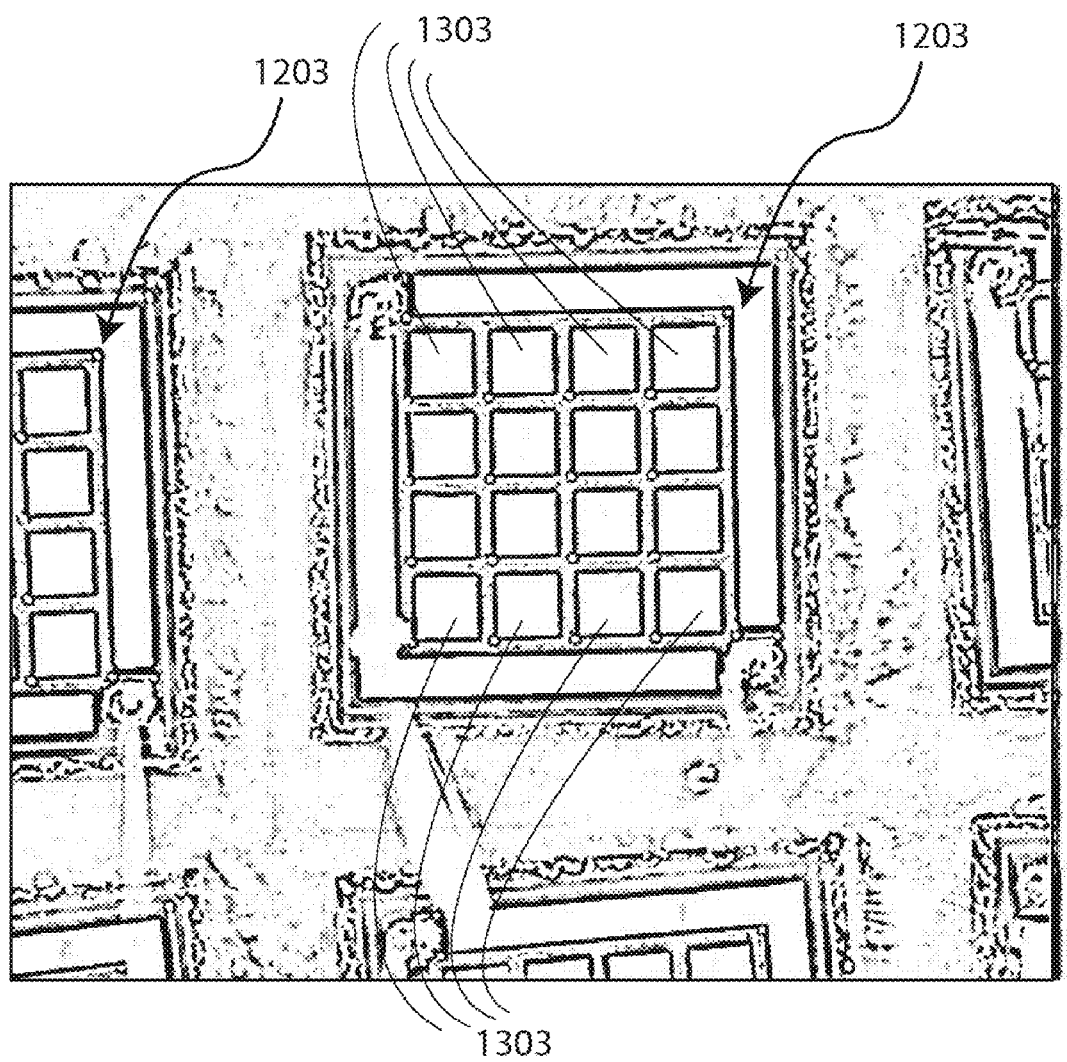
FIG. 13 shows a line drawing made from a photograph of an even more enlarged view of an array module such as shown in FIG. 1, showing individual sets of LEDs, including one complete set.

FIG. 13 shows a line drawing made from a photograph of an even more enlarged view of an array module, showing individual sets 1203 of LEDs, including one complete set. The sets 1203 of LEDs each include a 4×4 matrix of LED units 1303, each LED unit 1303 made up of 22×19 LEDs.

Figure 14:
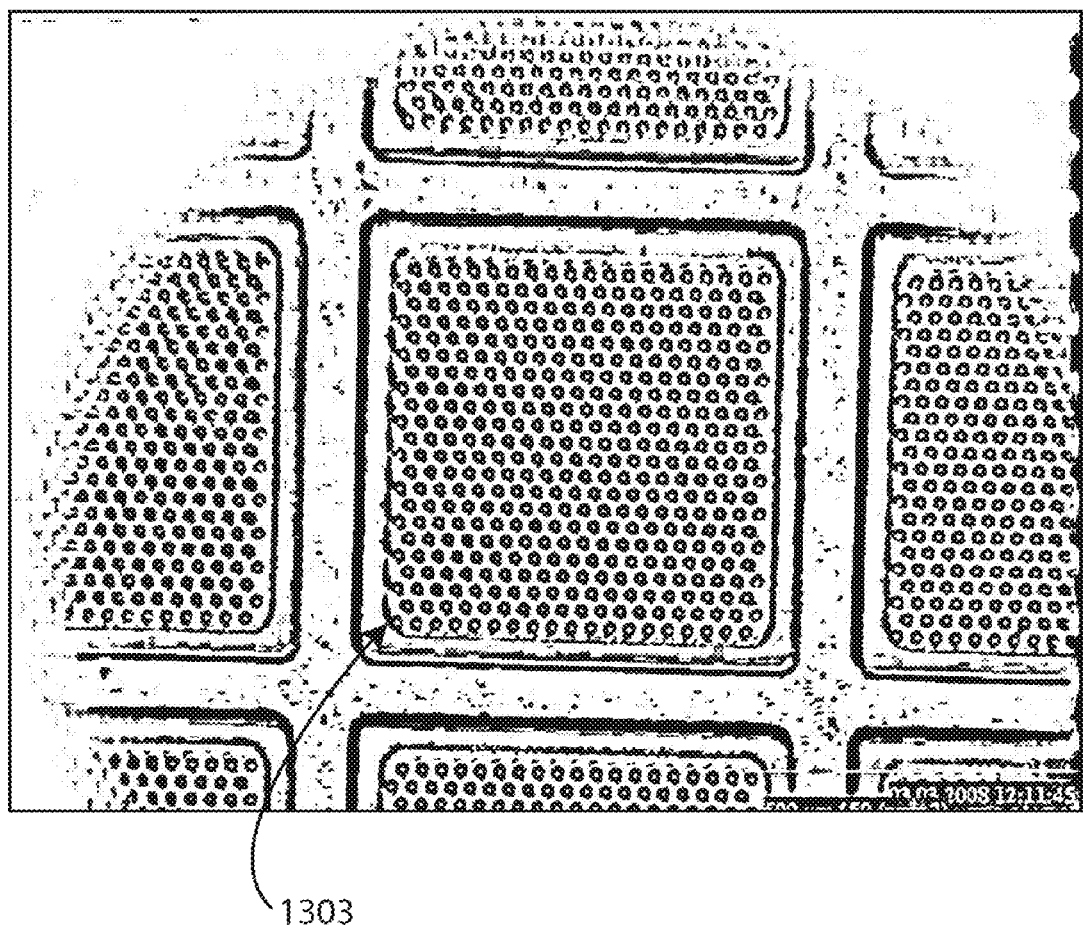
FIG. 14 shows a line drawing made from a photograph of a yet even more enlarged view of an array module such as shown in FIG. 1, showing individual units of LEDs, including one complete unit of 22×19 LEDs.

FIG. 14 shows a line drawing made from a photograph of a yet even more enlarged view of an array module, showing individual units 1303 of LEDs, including one complete unit 1303 of 22×19 LEDs.

Possible Theory of Operation

In order to enhance understanding of features of the present invention, a theory of operation is presented. Any such theory or mechanism of operation or finding presented herein is not intended to make the present invention in any way dependent upon such theory, mechanism of operation or finding.

The inventor has noticed several properties of curing at different intensity levels, i.e., different levels of power per unit area. Using a very simplified view of polymerization process, polymerization can be broken up into three reaction steps:

1) Activation of the starter radicals by UV light.
2) Chain growth of the polymer.
3) Chain ending through oxygen.

Each reaction has a certain time constant and total time. For common polymer plates such as Cyrel DPI™ from E.I. Dupont de Nemours and Company, Wilmington, Del. (DuPont), the time for the entire curing process is between 12 and 15 minutes at an illumination intensity (power per unit area) of 19-20 mW/cm².

This results in an energy per unit area of 14.4 to 18 Joules/cm² to get all radicals starting chains. The activating the radicals step occurs relatively fast when a starter radical interacts with a light photon. A long exposure time is required because the polymer material is not fully packed with starter radicals, and not every photon hits a starter radical. Thus it takes a certain amount of photons and consequently energy, to activate all starter radicals and in principle they could be activated all at the same time.

Polymers include a certain amount of oxygen. However, because conventional processes still enable flat tops, the amount of oxygen inside the plate in itself is not sufficient to get round tops. For round tops, it is believed additional oxygen has to diffuse into the plate.

Diffusion in dense matter is a slow process. If the intensity is increased, that is, there are more photons per unit area, more polymer chains can be started, while the number of chains finished by oxygen remains the same as with the lower intensity.

Figure 4A:
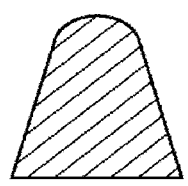
FIG. 4A shows simple cross-section of a round top halftone dot, e.g., as obtained in a digital process at a first intensity level.
Figure 4B:
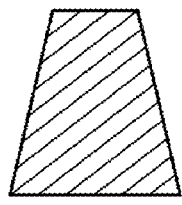
FIG. 4B shows simple cross-section of a flat top halftone dot, e.g., as obtained in a digital process at second intensity level.
Figure 4C:
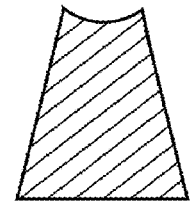
FIG. 4C shows simple cross-section of a concave top halftone dot, e.g., as obtained in a digital process at an intensity higher than the second intensity level.

The inventor has discovered that increasing the intensity can lead to more activation of the starter radicals. The inventor ran some experiments, and discovered that, staring with the specified curing for a plate, e.g., for certain common polymer types, e.g., DuPont's Cyrel DPI of exposure to around 19-20 mW/cm² for about 15 minutes, and then doubling the intensity from 20 mW/cm² to 40 mW/cm² gives a significant change from a convex round top to flat top. Indeed, if the power level is increased even further the top of the halftone dots will take a concave shape. FIG. 4A shows simple cross-section of a round top halftone dot, e.g., as obtained in a digital process at a first intensity level, e.g., 20 mW/cm². FIG. 4B shows simple cross-section of a flat top halftone dot, e.g., as obtained in a digital process at a second intensity level, e.g., 40 mW/cm². FIG. 4C shows simple cross-section of a concave top halftone dot, e.g., as obtained in a digital process at an intensity higher than the second intensity level.

Thus, changing power levels from a first level to a higher second level thus changes the dot shape. Conventional UV exposing units, however, do not lend themselves to operating at more than one power level, and typically are only capable of power sufficient for obtaining round tops. Conventional off-the-shelf fluorescent tube-based units, for example, do not readily lend themselves to increasing the UV power because there ore no tubes with higher output power available and as the tubes are already arranged very close together there is no space to double the number of tubes.

The Plates

By the terms "polymer plate" and "photopolymer plate" herein is meant a plate with any type of photo-curable material thereon, whether made of polymer or not. One example is UV-curable material. Another example is material cured by light of different wavelength, not necessarily UV. While today, such curing is typically carried with UV, and such materials are typically photopolymers, use of the term "photopolymer" herein is not meant to be limiting to a polymer composition. The inventor anticipates that in the future, there may be new materials and compositions that also are curable UV radiation of a desired wavelength, and the invention is equally applicable to plates having such material thereon.

The method and apparatuses described herein are used for curing many types of plates. The plates can be flexographic plates, flexographic imaging cylinders, flexographic sleeves, and so forth. The plate also can be letterpress plates having UV curable material thereon. Furthermore, the plates can be imaged using a conventional analog process, e.g., film, so that the curing is with the developed film over the plate material. Furthermore, the plates can be imaged using a digital process, e.g., by laser ablating an abatable surface on the plate material prior to final curing, so that curing is with the mask on the plate material after ablation of some of the mask material according to imaging data.

Therefore, in some embodiments, the plate is a photopolymer printing plate that is a digital plate.

In some embodiments, a photopolymer printing plate that is a conventional analog plate.

In some embodiments, the plate is a photopolymer printing plate that is a sleeve.

In some embodiments, the plate is a photopolymer printing plate that is a polymer coated cylinder.

Furthermore, some embodiments of the invention are in the form of a plate—any of the plates described above—that has been cured, the curing according to a method as described herein.

Furthermore, some embodiments of the invention are in the form of a plate—any of the plates described above—that has been imaged then cured, the curing according to a method as described herein.

General

Unless specifically stated otherwise, as apparent from the following discussions, it is appreciated that throughout the specification discussions utilizing terms such as "processing," "computing," "calculating," "determining" or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Note that when a method is described that includes several elements, e.g., several steps, no ordering of such elements, e.g., of steps is implied, unless specifically stated.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the DESCRIPTION OF EXAMPLE EMBODIMENTS are hereby expressly incorporated into this DESCRIPTION OF EXAMPLE EMBODIMENTS, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

All U.S. patent publications, U.S. patents, and U.S. patent applications cited herein are hereby incorporated by reference. In the case the Patent Rules or Statutes do not permit incorporation by reference of material that itself incorporates information by reference, the incorporation by reference of the material herein excludes any information incorporated by reference in such incorporated by reference material, unless such information is explicitly incorporated herein by reference.

Any discussion of prior art in this specification should in no way be considered an admission that such prior art is widely known, is publicly known, or forms part of the general knowledge in the field.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

What is claimed is:

1. An apparatus for curing a printing plate made of or having photo-curable material thereon, the apparatus comprising:
   a light exposure unit for exposing the whole printing plate after imaging in which an ablatable layer on the printing plate is selectively ablated with a laser beam, the light exposure unit including a light source to produce light energy at a wavelength or wavelengths suitable for curing the photo-curable material, the light exposure unit configured to generate to the plate after imaging at least a first illumination intensity sufficient to cure the photo-curable material and a second illumination intensity sufficient to cure the photo-curable material; and
   a control system coupled to and operative to control the light exposure unit exposing the whole plate after imaging to the first illumination intensity, or to the second illumination intensity, or to both the first illumination intensity and the second illumination intensity, and
   such that curing can produce printing features that have flat tops or round tops on the plate by the control system controlling whether the illumination intensity applied by the light exposure unit to the whole plate after imaging is the first illumination intensity, the second illumination intensity, or both the first and second illumination intensities.

2. An apparatus as recited in claim 1, further comprising:
   a drive mechanism to produce relative motion between the light exposure unit and the plate during curing of the plate;
   wherein the control system also is coupled to and configured to control the drive mechanism,
   such that whether the curing produces flat tops or round tops on the part of the plate is according to the illumination intensity output by the light exposure unit during an initial time period of the total time period that light energy illuminates the photo-curable material on the part of the plate.

3. An apparatus as recited in claim 2, wherein the light source moves during curing along a longitudinal direction parallel to the axis of rotation of a rotating drum on which the plate is attached.

4. An apparatus as recited in claim 2, wherein the light source moves during curing above the plate placed on a flatbed table.

5. An apparatus as recited in claim 2, wherein the light exposure unit extends to cover one dimension of the plate and wherein the relative motion includes relative motion in the direction perpendicular to the one dimension of the plate.

6. An apparatus as recited in claim 5, wherein the drive mechanism is configured to rotate a rotatable drum on which a photo-curable plate is placed, and wherein the light exposure unit extends to cover the length of the drum.

7. An apparatus as recited in claim 6, wherein the light source moves during curing in a transverse direction and the printing plate moves during curing in a longitudinal direction perpendicular to the transverse axis.

8. An apparatus as recited in claim 1, wherein the light source includes a plurality of LEDs and a power supply therefor.

9. An apparatus as recited in claim 1, wherein the light exposure unit includes:
   a light tunnel of light reflective walls and having a polygonal cross-section, each wall having a reflective inner surface; and
   the light source located at or near one end, called the source end of the light tunnel and arranged to produce light radiation to the inside of the light tunnel towards the other end of the light tunnel, called the plate end, including towards the reflective inner surfaces of the walls.

10. An apparatus as recited in claim 1, wherein the light source includes a plurality of arc lamps.

11. An apparatus as recited in claim 1, wherein the light source includes a combination of fluorescent light tubes and LEDs.

12. An apparatus as recited in claim 1, wherein the light source includes a combination of fluorescent light tubes and arc lamps.

13. An apparatus as recited in claim 1, wherein the light exposure unit includes a light tunnel of light reflective walls, the tunnel having a polygonal cross-section, with the light source located at or near one end, called the source end of the light tunnel and arranged in operation to produce light radiation to the inside of the light tunnel towards the other end of the light tunnel, called the plate end, including light radiation towards the reflective inner surfaces of the walls, such that light entering the light tunnel towards an inner reflective surface of a wall is reflected off the inner reflective surface so that it can emerge from the plate end.

14. An apparatus as recited in claim 1, wherein the light source is divided into two sections that illuminate different sized areas, and wherein at least one section's light output intensity can be controlled independently of the other section's light output intensity.

15. An apparatus as recited in claim 14, wherein the illumination intensity of each section can be controlled independently.

16. An apparatus as recited in claim 14, wherein two sections include a smaller area section and a larger area section, and wherein the smaller area section is capable of generating a higher output intensity than the larger area section.

17. An apparatus as recited in claim 16, wherein the illumination from the smaller area section hits a region in the plate's photo-curable material before the radiation from the larger area section hits the region.

18. An apparatus as recited in claim 1, wherein the first illumination intensity is sufficient to cure round tops in the photo-curable material.

19. An apparatus as recited in claim 1, wherein the second illumination intensity is higher than the first illumination intensity and is sufficient to cure flat tops in the photo-curable material.

20. An apparatus as recited in claim 1, wherein the second illumination intensity can be increased continuously to a level being sufficient to cure a desired shape between round top and flat top in the photo-curable material.

21. An apparatus as recited in claim 1, wherein the photo-curable plate is a photopolymer printing plate that is a flexographic plate.

22. An apparatus as recited in claim 1, wherein the photo-curable plate is a photopolymer printing plate that is a flexographic sleeve.

23. An apparatus as recited in claim 1, wherein the photo-curable plate is a photopolymer printing plate that is a polymer coated flexographic cylinder.

24. An apparatus as recited in claim 1, wherein the photo-curable plate is a photopolymer printing plate that is a letterpress plate.

25. An apparatus as recited in claim 1, wherein the photo-curable material is curable by ultraviolet light, and wherein the light source is a source of ultraviolet energy.

26. A method of curing a printing plate made of or having photo-curable material thereon, the method comprising:
curing the printing plate after imaging by producing light energy on the whole plate after imaging at a first illumination intensity sufficient to cure the photo-curable material, or on the whole plate after imaging at a second illumination intensity sufficient to cure the photo-curable material, or on the whole plate after imaging at both the first and the second illumination intensities at a wavelength or wavelengths suitable for curing the photo-curable material on the printing plate using a light exposure unit capable of generating at least the first illumination intensity and the second illumination intensity on the whole plate after imaging, wherein the imaging selectively ablates an ablatable layer on the printing plate with a laser beam;
such that curing can produce printing features on the plate that can be switched to have either flat tops or round tops by controlling whether the illumination intensity applied by the light exposure unit to the plate after imaging is the first illumination intensity, the second illumination intensity, or both the first and second illumination intensities.

27. A method as recited in claim 26, further comprising:
producing relative motion between the light exposure unit and the plate during curing of the plate; and
coordinating the relative motion and the illumination intensity from the light exposure unit, such that whether the curing produces printing features that are flat tops or round tops is according to the illumination intensity output by the light exposure unit during an initial time period that light energy illuminates the photo-curable material.

28. A method as recited in claim 27, further comprising during curing moving the light source along a longitudinal direction, while rotating a drum on which the plate is attached, the longitudinal direction being perpendicular to the circumferential direction of rotation.

29. A method as recited in claim 27, further comprising during curing moving the light source along the light source above the plate placed on a flatbed table.

30. A method as recited in claim 29, further comprising during curing moving the light source in a transverse direction and during curing moving the printing plate in a longitudinal direction perpendicular to the transverse axis.

31. A method as recited in claim 27, wherein the light source is divided into two sections that illuminate different sized areas, including a smaller area section and a larger area section and wherein at least one section's light output intensity can be controlled independently of the other section's light output intensity.

32. A method as recited in claim 31, wherein the illumination intensity of each section can be controlled independently.

33. A method as recited in claim 31, wherein the smaller area section is capable of generating a higher output intensity than the larger area section.

34. A method as recited in claim 33, wherein the illumination from the smaller area section hits a region in the plate's photo-curable material before the radiation from the larger area section hits the region.

35. A method as recited in claim 26, wherein the light source includes a plurality of LEDs and a power supply therefor.

36. A method as recited in claim 35, wherein the light exposure unit includes:
a light tunnel of light reflective walls and having a polygonal cross-section, wherein one example includes at least four walls, each wall having a reflective inner surface; and
the light source located at or near one end, called the source end of the light tunnel and arranged to produce light radiation to the inside of the light tunnel towards the other end of the light tunnel, called the plate end, including towards the reflective inner surfaces of the walls.

37. A method as recited in claim 26, wherein the light source includes a plurality of arc lamps.

38. A method as recited in claim 26, wherein the light source includes a combination of fluorescent light tubes and LEDs.

39. A method as recited in claim 26, wherein the light source includes a combination of fluorescent light tubes and arc lamps.

40. A method as recited in claim 26, wherein the light exposure unit includes a light tunnel of light reflective, e.g., mirrored walls and has a polygonal cross-section, with the light source located at or near one end, called the source end of the light tunnel and arranged in operation to produce light radiation, e.g., ultraviolet radiation to the inside of the light tunnel towards the other end of the light tunnel, called the plate end, including towards the reflective inner surfaces of the walls, such that light entering the light tunnel towards an inner reflective surface of a wall is reflected off the inner reflective surface so that it can emerge from the plate end.

41. A method as recited in claim 26, wherein the first illumination intensity is sufficient to cure round tops in the photo-curable material.

42. A method as recited in claim 26, wherein the second illumination intensity is higher than the first illumination intensity and is sufficient to cure flat tops in the photo-curable material.

43. A method as recited in claim 26, wherein the second illumination intensity can be increased continuously to a level being sufficient to cure a desired shape between round top and flat top in the photo-curable material.

44. A method as recited in claim 26, wherein the printing plate is a photopolymer printing plate that is a flexographic plate.

45. A method as recited in claim 26, wherein the printing plate is a photopolymer printing plate that is a flexographic sleeve.

46. A method as recited in claim 26, wherein the printing plate is a photopolymer printing plate that is a polymer coated flexographic cylinder.

47. A method as recited in claim 26, wherein the printing plate is a photopolymer printing plate that is a letterpress plate.

* * * * *

UNITED STATES PATENT AND TRADEMARK OFFICE
CERTIFICATE OF CORRECTION

PATENT NO. : 8,227,769 B2  Page 1 of 1
APPLICATION NO. : 12/467078
DATED : July 24, 2012
INVENTOR(S) : Sievers It is certified that error appears in the above-identified patent and that said Letters Patent is hereby corrected as shown below:

In Column 2, line 58, after "shown in", kindly replace "FIG. 1" with --FIG. 11--.

In Column 2, line 62, after "in", kindly replace "FIG. 1" with --FIG. 11--.

In Column 2, line 66, after "shown in", kindly replace "FIG. 1" with --FIG. 11--.

Signed and Sealed this
Twenty-eighth Day of August, 2012

David J. Kappos
*Director of the United States Patent and Trademark Office*